United States Patent
Minixhofer et al.

(10) Patent No.: US 8,426,936 B2
(45) Date of Patent: Apr. 23, 2013

(54) VERTICAL HALL SENSOR AND METHOD OF PRODUCING A VERTICAL HALL SENSOR

(75) Inventors: Rainer Minixhofer, Unterpremistaetten (AT); Sara Carniello, Graz (AT); Volker Peters, Fürth (DE)

(73) Assignee: austriamicrosystems AG, Unterpremstätten (AT)

( * ) Notice: Subject to any disclaimer, the term of this patent is extended or adjusted under 35 U.S.C. 154(b) by 241 days.

(21) Appl. No.: 12/731,059

(22) Filed: Mar. 24, 2010

(65) Prior Publication Data

US 2010/0252900 A1  Oct. 7, 2010

(30) Foreign Application Priority Data

Mar. 24, 2009  (EP) .................................... 09004206

(51) Int. Cl.
*H01L 43/04* (2006.01)
*H01L 43/14* (2006.01)

(52) U.S. Cl.
USPC ............. 257/421; 257/E43.003; 257/E43.007

(58) Field of Classification Search .................. 257/421, 257/E34.003, E43.007
See application file for complete search history.

(56) References Cited

U.S. PATENT DOCUMENTS

| 4,987,467 | A | * | 1/1991 | Popovic | 257/427 |
| 5,572,058 | A | | 11/1996 | Biard | |
| 6,255,190 | B1 | | 7/2001 | Kröner | |
| 6,542,068 | B1 | | 4/2003 | Drapp et al. | |
| 6,639,290 | B1 | | 10/2003 | Hohe et al. | |
| 6,727,563 | B1 | | 4/2004 | Hohe et al. | |
| 6,903,429 | B2 | | 6/2005 | Berndt et al. | |
| 7,038,448 | B2 | | 5/2006 | Schott et al. | |
| 7,358,724 | B2 | | 4/2008 | Taylor et al. | |
| 2004/0018644 | A1 | | 1/2004 | Johnson et al. | |
| 2005/0230769 | A1 | | 10/2005 | Lilian et al. | |
| 2005/0230770 | A1 | | 10/2005 | Oohira | |
| 2006/0011999 | A1 | | 1/2006 | Schott et al. | |
| 2006/0097715 | A1 | | 5/2006 | Oohira et al. | |
| 2006/0157809 | A1 | | 7/2006 | Alimi et al. | |
| 2006/0170406 | A1 | | 8/2006 | Kawashima et al. | |
| 2007/0096717 | A1 | | 5/2007 | Ishihara | |
| 2007/0290682 | A1 | | 12/2007 | Oohira et al. | |

FOREIGN PATENT DOCUMENTS

| AT | 002 173 | 5/1998 |
| DE | 199 54 360 | 5/2001 |
| EP | 1 129 495 | 9/2001 |

(Continued)

OTHER PUBLICATIONS

Popovic, R. S., "The Vertical Half-Effect Device", IEEE Electron Device Letters, vol. EDL-5, No. 9, pp. 357-358, 1984.

*Primary Examiner* — Calvin Lee
*Assistant Examiner* — Monica D Harrison
(74) *Attorney, Agent, or Firm* — Cozen O'Connor

(57) ABSTRACT

Through a main surface (10) of a semiconductor substrate (1) of a first type of conductivity, a doped well of a second type of conductivity is implanted to form a sensor region (3) extending perpendicularly to the main surface. The sensor region can be confined laterally by trenches (5) comprising an electrically insulating trench filling (6). The bottom of the sensor region is insulated by a pn-junction (20). Contacts (4) are applied to the main surface and provided for the application of an operation voltage and the measurement of a Hall voltage.

9 Claims, 4 Drawing Sheets

FOREIGN PATENT DOCUMENTS

| | | |
|---|---|---|
| EP | 1 436 849 | 7/2004 |
| EP | 1 438 755 | 7/2004 |
| WO | WO 00/02266 | 1/2000 |
| WO | WO 2004/025742 | 3/2004 |
| WO | WO 2006/028426 | 3/2006 |
| WO | WO 2007/121885 | 11/2007 |

* cited by examiner

VERTICAL HALL SENSOR AND METHOD OF PRODUCING A VERTICAL HALL SENSOR

RELATED APPLICATIONS

This application claims the priority of European application no. 09004206.0 filed Mar. 24, 2009, the entire content of which is hereby incorporated by reference.

FIELD OF THE INVENTION

The present invention relates to a vertical semiconductor Hall sensor and to a method of producing a vertical semiconductor Hall sensor, which can be applied in a conventional semiconductor technology, especially in a CMOS process.

BACKGROUND OF THE INVENTION

The Hall effect, named after the American physicist Edwin Herbert Hall (1855-1938), produces a potential difference across a conductor carrying an electric current when a magnetic field is applied in a direction perpendicular to that of the current flow. It is employed in Hall sensors for the measurement of magnetic fields. The conductor of a Hall sensor is usually a plate of an electrically conducting material provided on opposite edges with electrodes serving to apply an operation voltage, which makes an electric current flow through the plate in the direction from one electrode to the other. In the presence of a magnetic field with a component that is perpendicular to the plane of the plate, a Hall voltage is generated within the plate in a direction that is orthogonal both to the current and to this component of the magnetic field and can be detected by means of further electrodes provided at opposite edges of the plate in the direction across the current. A Hall sensor can be realized as a semiconductor device with integrated circuit and manufactured in CMOS technology, for example.

Vertical Hall sensors comprising a conductor plate that is perpendicular to an upper chip surface are sensitive to magnetic fields having a component normal to the plate and parallel to the chip surface and are therefore important in products like rotary encoders and accelerometers which require a two-dimensional or three-dimensional measurement of the magnetic field. The integration of Hall sensors for two or three spatial dimensions together with the related circuits on the same chip allows a production of compact and reliable products within a CMOS process. Since conventional semiconductor technologies are mainly directed to the production of layered structures that are coplanar with the chip surface, the vertical arrangement of the conductor plate of a semiconductor Hall sensor requires special solutions.

R. S. Popovic: "The vertical Hall-effect device", IEEE Electron Device Letters EDL-5 (1984), page 357, describes a vertical device having an arrangement of contacts on the chip surface.

EP 0 1 129 495 B1 describes an integrated Hall device comprising a plate-like active region integrated in a doped silicon substrate perpendicularly to a structured substrate surface, which is provided with contacts for the application of an operation voltage and the detection of a Hall voltage. The active region is doped by an implantation through sidewalls of trenches, which are subsequently filled. The active region is electrically insulated from the rest of the substrate by a pn-junction.

EP 0 1 438 755 B1 describes a vertical Hall sensor comprising a plate-like electrically conductive region extending into a substrate perpendicularly to the surface of the substrate. A small outer surface of the plate is located in the substrate surface and is provided with contacts for the application of an operation voltage and the detection of a Hall voltage.

WO 2007/0 121 885 A1 describes a vertical Hall sensor comprising a semiconductor substrate having a main surface, a semiconductor region of a first type of conductivity, which extends from the main surface into the substrate, a plurality of contacts on the main surface in the area of said semiconductor region, and a plurality of non-conducting barrier regions, which extend from the main surface into said semiconductor region. The barrier regions are disposed between each pair of neighboring contacts and are provided to keep an operating current that flows between the contacts away from the main surface. The resistance is increased, since the current path around the barrier regions is longer.

U.S. Pat. No. 6,255,190 B1 describes a method of forming very deep pn-junctions by means of deep trench sidewall predeposition technology without using epitaxy or extensively high temperature processing. If the trenches have a sufficient longitudinal extension and a sufficient depth, an n-type region surrounded with p-type semiconductor material can be established by this method and used to realize a Hall sensor. The n-type region is obtained by an implantation of n-type dopants into sidewalls of deep trenches and encompasses the trenches. It serves as a vertical electrically conductive plate of the Hall sensor and, if a sensing contact is placed outside the area delimited by the trenches, also as contact pillar or sinker contact to connect the surface contact with the bottom of the plate that is formed between the trenches.

SUMMARY OF THE INVENTION

It is an object of this invention to disclose an improved vertical semiconductor Hall sensor and a method of producing a vertical Hall sensor that is especially suited to be applied in a CMOS process.

This and other objects are attained in accordance with one aspect of the invention directed to a vertical Hall sensor, comprising a substrate comprising semiconductor material of a first type of conductivity, the substrate having a main surface; a doped well of a second type of conductivity at the main surface, the doped well forming a sensor region extending perpendicularly to the main surface; contacts of the sensor region, the contacts being located on areas of the main surface and provided for the application of an operation voltage; further contacts located on further areas of the main surface and provided for sensing a Hall voltage; wherein the contacts and further contacts are arranged in such a manner that, in the presence of a magnetic field component parallel to the main surface and of a current through the sensor region generated by an operation voltage applied to the contacts, a Hall voltage that is generated can be measured via the further contacts; and a pn-junction between the sensor region and the semiconductor material of the first type of conductivity; the sensor region having a higher doping at an area of the pn-junction that is remote from the main surface than at the main surface, and/or an area of the pn-junction that is remote from the main surface being confined by trenches laterally with respect to the main surface, the trenches and the sensor region having depths, as measured from the main surface down into the substrate, the depth of the trenches being larger than the depth of the sensor region.

Another aspect of the invention is directed to a method of producing a vertical Hall sensor, comprising the steps of: implanting a dopant provided for a second type of conductivity into a semiconductor substrate of a first type of conductivity from a main surface of the substrate in the way of producing a doped well; forming an electrically conductive sensor region by means of the dopant; and applying contacts provided for an operation voltage generating a current through the sensor region, and applying further contacts provided for sensing a Hall voltage onto areas of the main surface.

A further object of the invention is directed to a method of producing a vertical Hall sensor, comprising the steps of: forming a parallel trenches at a main surface of a semiconductor substrate of a first type of conductivity, the trenches each having sidewalls and a bottom; forming doped bottom regions by an implantation of a dopant provided for a second type of conductivity into the bottoms of the trenches; diffusing the dopant, thus forming a sensor region; and applying contacts provided for an operation voltage generating a current through the sensor region and applying further contacts provided for sensing a Hall voltage onto areas of the main surface.

The vertical Hall sensor is arranged at a main surface of a substrate comprising semiconductor material of a first type of conductivity, which can be a low p-type doping, for example. A doped well of a second type of conductivity, which can be n-type conductivity, for example, is implanted at the main surface and forms an electrically conductive sensor region of the Hall sensor. The sensor region has a major dimension extending perpendicularly to the main surface into the substrate. The sensor region can particularly have the shape of a plate, the plane of largest extension of which is arranged vertically with respect to the main surface. A pn-junction between the sensor region and the semiconductor material of the first type of conductivity is provided as an electric insulation of the sensor region towards the bulk of the substrate and is favorable in view of reducing a space charge region. Contacts of the sensor region are located on areas of the main surface and provided for the application of an operation voltage, which generates an operation current through the sensor region. Further contacts are located on further areas of the main surface and provided for sensing a Hall voltage generated by the presence of a magnetic field. The contacts and further contacts are arranged in such a manner that, when a current through the sensor region is generated by an operation voltage applied to the contacts, a Hall voltage is generated in the presence of a magnetic field component that is parallel to the main surface and the Hall voltage can be detected via the further contacts.

An important factor of the performance of the Hall sensor is the space charge region at the pn-junction between the sensor region, which is provided as the active region of the Hall sensor, and the adjacent semiconductor material of the first type of conductivity. This is especially true of the area of the pn-junction that is located at the maximum distance from the main surface, forming a lower boundary of the sensor region.

An embodiment of the invention comprises a sensor region that has a higher doping at an area of the pn-junction at the bottom of the sensor region, remote from the main surface, than at the main surface. The concentration of the dopant is therefore larger in a lower portion of the sensor region, which is located in the vicinity of the pn-junction between the sensor region and the semiconductor material of the first type of conductivity.

A further embodiment of the invention comprises a highly doped buried region of the second type of conductivity located at the pn-junction and forming a highly doped lower portion of the sensor region, which reduces the thickness of the space charge region and, consequently, its influence on the device performance. In further embodiments the highly doped buried region or lower portion of the sensor region can also serve as deep, low-resistive path for the operation current.

Further embodiments of the Hall sensor comprise trenches, preferably relatively deep trenches, which confine the sensor region laterally with respect to the main surface. The trenches are preferably deeper than the sensor region, so that the bottoms of the trenches are located on a lower level, which means at a larger distance from the main surface, than the pn-junction formed by the lower boundary of the sensor region. The sensor region may be completely enclosed by trenches laterally with respect to the main surface. The trenches can be filled with dielectric or electrically insulating material to isolate the sensor region from the surrounding semiconductor material. The trenches can be provided together with deep or shallow isolation trenches separating active areas of further integrated components.

The bottom isolation of the sensor region is effected by the pn-junction. The lateral isolation by deep insulating trenches improves the cross-talk behaviour of the device and helps to reduce its size but does not affect the physics of the device adversely: the same device concepts can be realized with a lateral trench isolation or with a lateral pn-junction isolation. If the sensor region is precisely delimited by deep trenches, the performance of the Hall sensor is not influenced by a lateral space charge region.

Further embodiments comprise a substrate with an epitaxially grown layer, called epilayer, forming an upper layer of the substrate and the main surface. For the purpose of the following description and the claims, the epilayer is regarded as a part of the substrate. The epilayer can be doped for the same type of conductivity as the bulk of the substrate or left undoped, for example. The epilayer is especially advantageous if the lower pn-junction is to be formed by a highly doped buried region of the second type of conductivity forming a highly doped lower portion of the sensor region, because this can be produced by an implantation of a dopant into the substrate surface before the growth of the epilayer. After this implantation the epilayer is grown on the same substrate surface, and the dopant is diffused to form a doped region extending into the epilayer, possibly up to the main surface. This procedure renders a sensor region with a doping profile having a higher concentration of doping atoms at the pn-junction than near the main surface. The performance of the Hall sensor is improved if the extension of the depletion layer which modulates the active region and introduces asymmetries is reduced and the vertical current through the sensor region increased by means of the highly doped buried region near the insulating pn-junction at the bottom of the sensor region.

An embodiment of the method of producing a Hall sensor makes use of an implantation step in the way of producing a doped well similar to the conventional manufacturing of integrated circuits, especially CMOS circuits. The implantation may be a dedicated process step, while the drive-in and diffusion of the doping atoms can take place simultaneously with the formation and anneal of the wells provided for CMOS transistors or other components of an integrated circuit. A standard implantation from the top surface into the active area gives a higher precision of the doping profile than an implantation into sidewalls of structures like trenches or recesses.

A highly doped buried region can be generated, for example, in the following way. A dopant for a second type of conductivity, n-type for example, is implanted into a semiconductor substrate of a first type of conductivity, p-type for example, to form a doped region like an island at the surface of the substrate. Then an epitaxial layer is grown on this surface. During the epitaxial growth, a diffusion of the dopant makes the doped region expand in the direction of the epilayer and also further into the substrate. If the doping concentration was sufficiently high, the diffusion can be effected to form the complete sensor region. Otherwise, a further implantation of a dopant for the second type of conductivity can be performed in the way of producing a doped well, after the formation of the epilayer, in order to form a doped surface region above the highly doped buried region. A diffusion of the dopant is then effected until the doped buried region and the doped surface region merge and form the sensor region. Optionally further CMOS process steps can be performed using the epitaxial layer, which now forms the main surface of the substrate to be processed.

Although the pn-junction may provide a sufficient isolation of the sensor region also laterally, parallel deep trenches can be etched to isolate the sensor region and to confine it laterally to a precisely defined volume, which may be like a vertical plate, for example. The trenches can be filled with an electrically insulating material, like an oxide or nitride of the semiconductor material, for instance. The trenches can be produced together with deep or shallow isolation trenches separating active areas of further integrated components. The trenches confining the sensor region are preferably deep, so that the bottoms of the trenches are located at a larger distance from the main surface than the pn-junction formed by the lower boundary of the sensor region. Thus the sensor region is laterally completely confined at least in two opposite directions. The sensor region may also be completely enclosed laterally by deep trenches laterally surrounding the sensor region. A highly doped buried region as described in the previous paragraph can be provided independently of the presence of deep trenches.

Another method of producing a comparatively higher doping at the bottom of the sensor region makes use of a high-dose implantation of a dopant into the bottoms of parallel deep trenches before introducing an insulating trench filling. An additional implantation into the sidewalls of the trenches can be performed, which helps to enlarge the doped region up to the main surface.

The method mainly uses only method steps of a standard CMOS technology. The doping can be controlled especially well if only standard implantation and diffusion steps are performed. If a highly doped buried region is desired, dedicated process steps may be necessary.

DETAILED DESCRIPTION OF THE DRAWINGS

Figure 1:
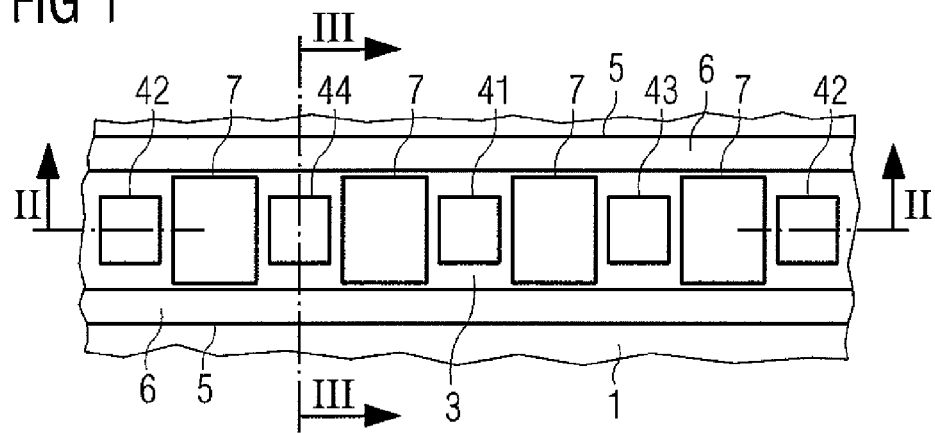
FIG. 1 shows a plan view of an embodiment of the vertical Hall sensor.

FIG. 1 shows a plan view of an embodiment of the vertical Hall sensor. A sensor region 3 is formed in a semiconductor substrate 1 by an implantation of a dopant through a main upper surface of the substrate 1 in the way of producing a doped well. Therefore, there is no need for a structure in the main surface, which can be essentially flat. In the embodiment shown in FIG. 1, the sensor region 3 is laterally confined at least on two opposite sides by trenches 5, which can comprise an electrically insulating trench filling 6. The trench filling 6 can be an oxide or a nitride of the semiconductor material of the substrate, especially silicon dioxide or $Si_3N_4$, for example.

The substrate 1 has a first type of electric conductivity, which can be generated by a weak doping of the semiconductor material, for instance. The substrate 1 can particularly be a lightly doped p-type silicon substrate. The sensor region 3 comprises an electric conductivity of the opposite second type. If the substrate 1 is p-type doped, the sensor region 3 can be n-type doped. The doping is sufficiently high to make the sensor region 3 an electric conductor that can be used as conductor plate of the Hall sensor.

Further doped regions 7 of the first type of conductivity are optionally arranged in the sensor region 3. The further doped regions 7 provide pn junctions acting as electric barriers to direct the operation current deeper into the substrate. Barrier regions of dielectric or electrically insulating material may be used for the same purpose instead of the further doped regions 7 shown in FIG. 1. Contacts 41, 42 are applied to the sensor region 3 on areas of the main surface and provided for the application of an operation voltage. Further contacts 43, 44 are applied to the sensor region 3 on further areas of the main surface and provided for sensing a Hall voltage. The further doped regions 7 separate the areas of the main surface on which the contacts 41, 42, 43, 44 are located.

Figure 2:
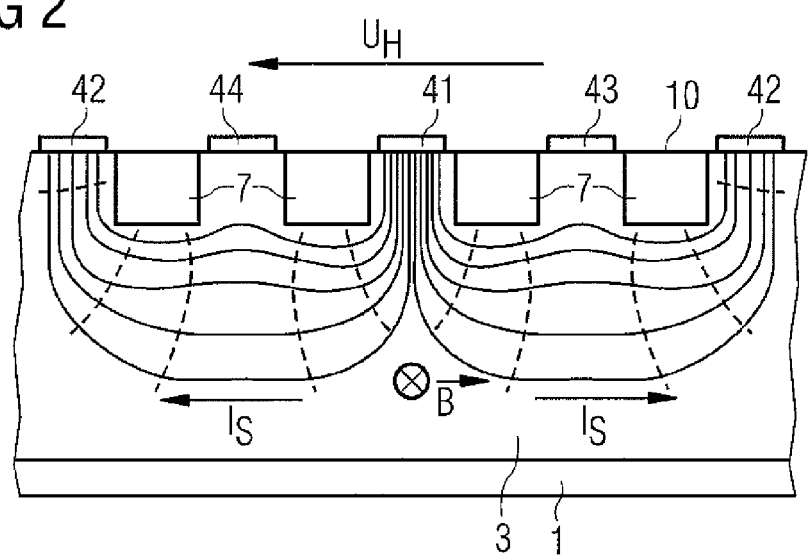
FIG. 2 shows a cross-section of the embodiment according to FIG. 1 at the first position indicated in FIG. 1.

FIG. 2 shows a cross-section of the embodiment according to FIG. 1 near the main surface 10 of the substrate 1 at the position indicated with II/II in FIG. 1, parallel to the trenches 5. The sensor region 3 is a doped well extending into the substrate 1, so that a vertically arranged plate-like conductor is formed between the parallel trenches 5. The further doped regions 7 are arranged in the sensor region 3 and also extend into the substrate 1, but have a smaller depth than the sensor region 3. The pn-junction between the further doped regions 7 and the surrounding sensor region 3 functions as an electric insulation or barrier.

FIG. 2 also explains the operation of the Hall sensor. An operation voltage applied between the central contact 41 and the outer contacts 42 generates an operation current $I_S$ through the sensor region 3 around the further doped regions 7. The outer contacts 42 are on the same electric potential and can be electrically connected for this purpose. The current $I_S$ is split and flows along opposite current paths indicated by the arrows in FIG. 2. In the presence of a component of a magnetic field B that is normal to the plane of the drawing and oriented as shown in FIG. 2, a Hall voltage $U_H$ is generated transversely to the local direction of current $I_S$ and the magnetic field B. The curved, solid lines indicate some paths of the current. The main direction of the current is indicated by the arrow marked $I_S$. The direction of the generated Hall voltage $U_H$ is shown by curved, broken lines as being transverse at every point to the curved, solid lines of currents $I_S$ and within the plane of the paper. The Hall voltage $U_H$ can be detected and measured via the further contacts 43, 44. The further doped regions 7 direct the current $I_S$ down into the substrate 1 and thus enhance the vertical components of the current $I_S$. The arrangement of the sensor region 3, the contacts 41, 42, and the further contacts 43, 44 is thus homeomorphic or even conformal to a plate-like active region of rectangular shape having contacts for the operation voltage on two opposite sides and further contacts for the measurement of a Hall voltage on the other opposite sides.

Figure 3:
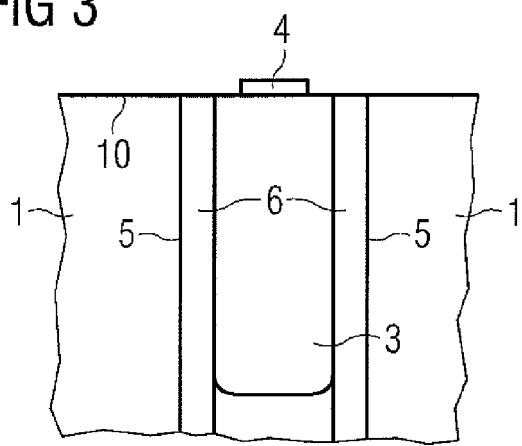
FIG. 3 shows a cross-section of the embodiment according to FIG. 1 at the second position indicated in FIG. 1.

FIG. 3 shows a cross-section of the embodiment according to FIG. 1 near the main surface 10 of the substrate 1 at the position indicated with III/III in FIG. 1, transverse to the trenches 5. One of the contacts 4 (the term "contact 4" is used to generally refer to any of contacts 41, 42, 43 and 44; in FIG. 3 it can refer to contacts 44) that are arranged on the main surface 10 is shown to be applied to the sensor region 3. FIG. 3 clearly shows the lateral confinement of the sensor region 3 by the trenches 5 and trench fillings 6. In this type of embodiment, it is preferred to have trenches 5, but the trenches 5 are not indispensable if the doped well of the sensor region 3 is implanted sufficiently narrow and the pn-junction at the boundary of the sensor region 3 serves as electric confinement also laterally.

The further doped regions 7 improve the device performance if both the contacts provided for the operation voltage and the further contacts provided for the measurement of the Hall voltage are arranged on the main surface of the substrate. It is also possible to realize embodiments of the Hall sensor having a sensor region formed in the fashion of an implanted doped well, in which one contact on the main surface is electrically conductively connected with the bottom of the sensor region.

In the following, some further embodiments and appertaining methods of production are described, which make use of laterally confining trenches having a larger depth than the sensor region. In these embodiments, the use of further doped regions according to the arrangement shown in FIGS. 1 to 3 may be preferred.

Figure 4:
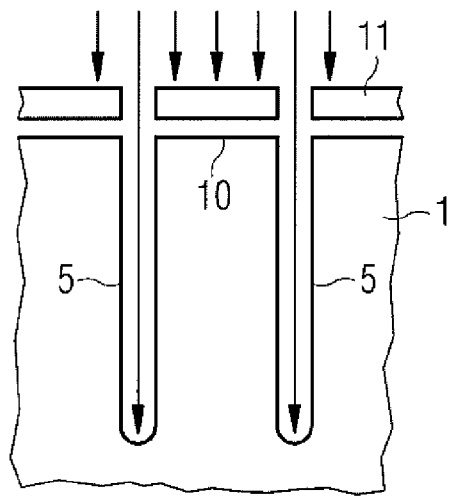
FIG. 4 shows a cross-section of an intermediate product of a method of producing a vertical Hall sensor during an etching step.

FIG. 4 shows a cross-section of an intermediate product of a method of producing a vertical Hall sensor comprising a sensor region that is laterally confined by deep trenches. A first mask 11—the masks will be numbered to make a distinction between them—is used to etch parallel trenches 5, which are comparatively narrow and deep, into a main surface 10 of a semiconductor substrate 1 having a first type of conductivity.

Figure 5:
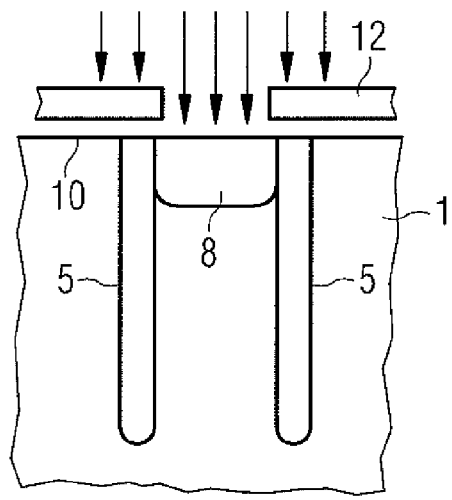
FIG. 5 shows a cross-section according to FIG. 4 during an implantation step.

FIG. 5 shows a cross-section according to FIG. 4 during an implantation step. A second mask 12 is used to implant a dopant provided for the opposite second type of conductivity through the main surface 10 into the region between the trenches 5 in the way of implanting a doped well. The doped region 8 thus produced is located at the main surface 10 and extends some way down into the substrate 1. As schematically shown in FIG. 5, which is, like all the figures, not drawn to scale, the doped region 8 may be kept shallow by an appropriate adjustment of the implantation energy and dose.

Figure 6:
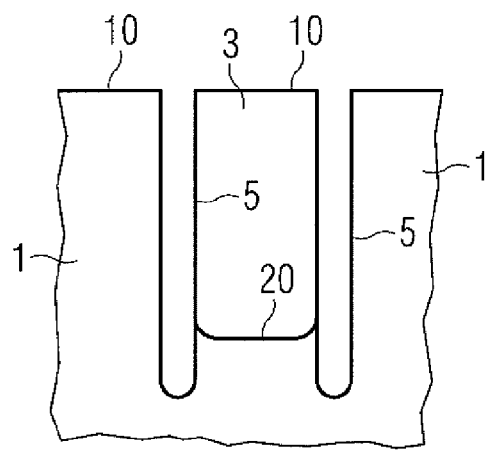
FIG. 6 shows a cross-section according to FIG. 5 after a diffusion step.

FIG. 6 shows a cross-section according to FIG. 5 after the generation of a diffusion of the dopant, which can be achieved by raising the temperature. In the course of the diffusion, the doped region 8 is enlarged to form the sensor region 3. The pn-junction 20 at the bottom of the doped region 3 is still well above the level of the bottoms of the trenches 5. The pn-junction 20 provides an isolation of the sensor region 3 from the adjacent semiconductor material of the first type of conductivity.

Figure 7:
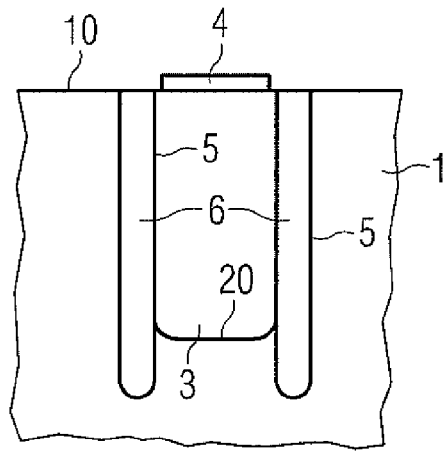
FIG. 7 shows a cross-section according to FIG. 6 after an application of trench fillings and contacts.

FIG. 7 shows a cross-section according to FIG. 6 after filling the trenches 5 and applying the contacts. The trench fillings 6 can be a dielectric material like an oxide or nitride of the semiconductor material of the substrate, for instance. It can be introduced into the trenches 5 or formed by a thermal oxidation of the sidewalls of the trenches 5, for example. The trench fillings 6 can be produced by any of the standard process steps which are used to fill deep or shallow trenches separating active areas of components of an integrated circuit, like a CMOS circuit, for example. The sequence of process steps described in conjunction with FIGS. 4 to 7 may be preferred, but it is also possible to etch the trenches 5 after the implantation of the doped region 8 or to apply the trench fillings 6 before the implantation of the doped region 8. The mentioned process steps can be standard steps of a typical CMOS process; no dedicated steps are required to produce the embodiment according to FIGS. 4 to 7.

The embodiments that will now be described in conjunction with FIGS. 8 to 13 require some pre-processing steps, followed by steps that are standard in typical CMOS processes.

Figure 8:
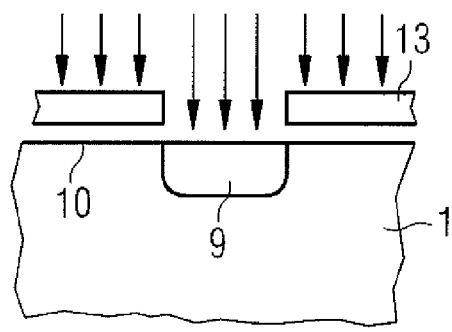
FIG. 8 shows a cross-section of an intermediate product of a further method of producing a vertical Hall sensor during an implantation step.

FIG. 8 shows a cross-section of an intermediate product of a method of producing a further embodiment of the vertical Hall sensor. A third mask 13 is used to implant a dopant provided for the opposite second type of conductivity through the main surface 10 of a semiconductor substrate 1 having a first type of conductivity. The doped region 9 thus produced is located at the main surface 10 and extends some way down into the substrate 1. If the substrate 1 is a lightly p-doped substrate, the doped region 9 is of n-type conductivity. The doped region 9 is preferably highly doped and provided for a highly doped buried region in the substrate 1.

Figure 9:
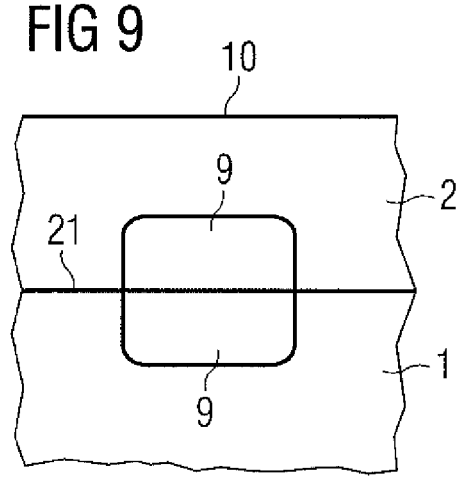
FIG. 9 shows a cross-section according to FIG. 8 after an epitaxial growth and a diffusion of the dopant.

FIG. 9 shows a cross-section according to FIG. 8 after an epitaxial growth and a diffusion of the dopant. The epitaxial growth serves to produce an epilayer 2 on the main surface 10 of the substrate 1. The epilayer 2 shall here be regarded as a part of the substrate 1 and forms a new main surface 10 as well as an interface 21 on the level of the previous main surface of the substrate 1. The conditions during the growth of the epilayer 2 and the associated thermal budget induce a diffusion of the implanted dopant of the doped region 9 towards the new main surface 10 and also deeper into the substrate 1. FIG. 9 shows the doped region 9 thus enlarged on both sides of the interface 21.

Figure 10:
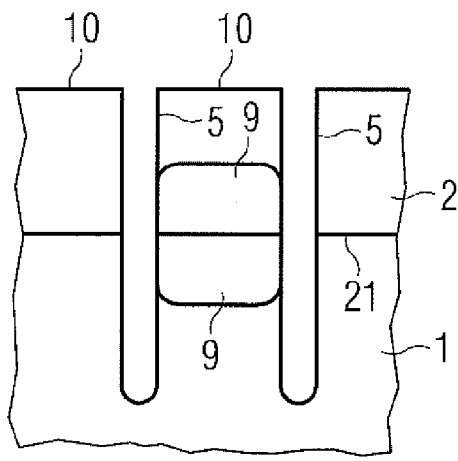
FIG. 10 shows a cross-section according to FIG. 9 after the etching of trenches.

FIG. 10 shows a cross-section according to FIG. 9 after the etching of trenches 5, which takes place in a similar way as already described in conjunction with FIG. 4. The trenches 5 are etched at least down to the interface 21 and preferably even deeper into the substrate 1 to form lateral confinements of the doped region 9.

Figure 11:
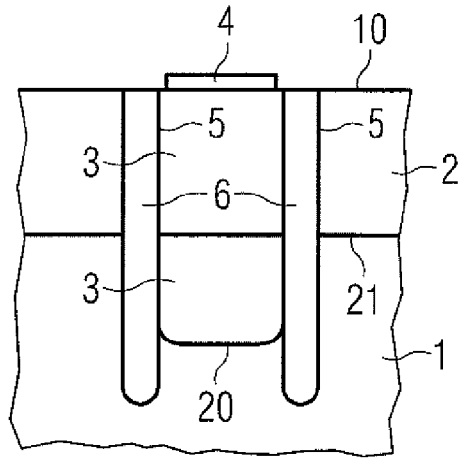
FIG. 11 shows a cross-section according to FIG. 10 after a diffusion and an application of trench fillings and contacts.

FIG. 11 shows a cross-section according to FIG. 10 after a diffusion and an application of trench fillings 6 and contacts 4, preferably by standard CMOS process steps. The diffusion of the dopant expands the highly doped buried region formed by the doped region 9. If the doped region 9 thus attains the main surface 10, it already forms the sensor region 3. In this case no further implants are necessary to realize the desired doping profile of the sensor region 3, which is high in the vicinity of the interface 21 and low near the main surface 10. Simulations gave a final concentration of doping atoms of typically $2\times10^{18}$ cm$^{-3}$ in the vicinity of the interface 21, if the epilayer 2 is grown 6 μm thick.

If the diffusion of the dopant cannot be effected in a manner that the doped region 9 finally reaches the main surface 10, which may occur when the concentration of the dopant is too low or the epilayer 2 is relatively thick, the sensor region can be completed by means of a doped surface region.

Figure 12:
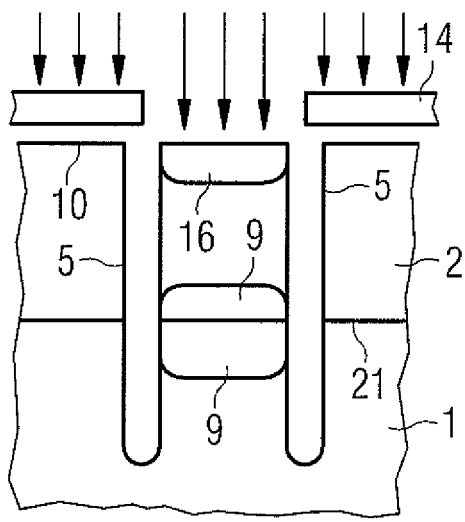
FIG. 12 shows a cross-section according to FIG. 10 during an implantation of a doped surface region.

FIG. 12 shows a cross-section according to FIG. 10 during an implantation of a doped surface region 16 through the main surface 10 in the way of producing a doped well. The area of implantation is defined by a fourth mask 14, and the dopant is provided for the second type of conductivity. If the second type of conductivity is n-type conductivity, for instance, the doped surface region 16 can be produced together with n-type wells of integrated CMOS components in a standard CMOS process, for example. A shallow implantation is sufficient, if the dopant is subsequently diffused so that the doped region 9 and the doped surface region 16 merge into one continuous doped region forming the sensor region.

Figure 13:
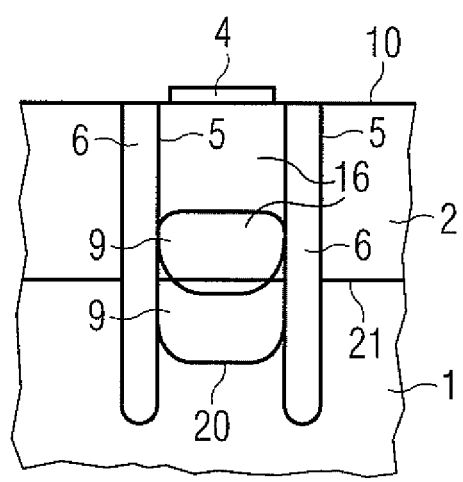
FIG. 13 shows a cross-section according to FIG. 12 after a diffusion and an application of trench fillings and contacts.

FIG. 13 shows a cross-section according to FIG. 12 after a diffusion of the dopant to make the doped region 9 and the surface region 16 expand and overlap to form a continuous doped region of the second type of conductivity, and after an application of a trench filling 6 and contacts 4. In the embodiment thus obtained the sensor region has a bottom boundary defined by a pn-junction 20, which is located on a higher level than the bottoms of the trenches 5. The sensor region is thus laterally confined by the trench fillings 6 and isolated vertically towards the semiconductor material of the first type of conductivity by the pn-junction 20. The concentration of the doping of the doped surface region 16 can be adjusted so that the final doping profile of the sensor region comprises a high concentration of doping atoms in the vicinity of the interface 21 and a lower concentration of doping atoms near the main surface 10.

In embodiments according to FIG. 11 or 13, comprising a buried region of higher doping concentration in the active sensor region, the path of the major current flow is deeper in the substrate than in an embodiment according to FIG. 7, for example, and the vertical component of the current is consequently larger. To increase the deep current flow at a distance from the main surface further, the current can be forced towards the highly doped buried region by arranging insulating barriers between the contacts, as described above in conjunction with FIGS. 1 to 3. An embodiment of such a device may be manufactured as follows. An n-type well is implanted in a weakly doped p-type substrate. An epilayer is grown to a thickness of typically about 4 μm to 6 μm. The sensor region is formed by a diffusion or by a further implantation and a subsequent diffusion according to the embodiments of FIGS. 11 and 13, respectively. P-type wells are then implanted in the sensor region to form the further doped regions 7 according to FIGS. 1 to 3. A long thermal drive-in step to anneal the implants and an application of the contacts in an arrangement as shown in FIGS. 1 and 2 render an embodiment that does not require an electric connection to the bottom of the sensor region. The long thermal drive-in step diffuses the buried n-type well implant towards the main surface and also deeper into the substrate, and the p-type well implant from the main surface deeper into the substrate. The p-type wells forming the further doped regions 7 are an insulating barrier for the current, which is forced to flow deep into the highly doped buried region in the vicinity of the interface 21 of the epilayer 2. An advantage of the presence of the highly doped buried region is the enhancement of the vertical component of the operation current, which renders an increased sensitivity of the Hall sensor. A further advantage is the desired reduction of the electric resistance of the elongated current path around the barriers, because the electric conductivity increases with increasing doping concentration.

Figure 14:
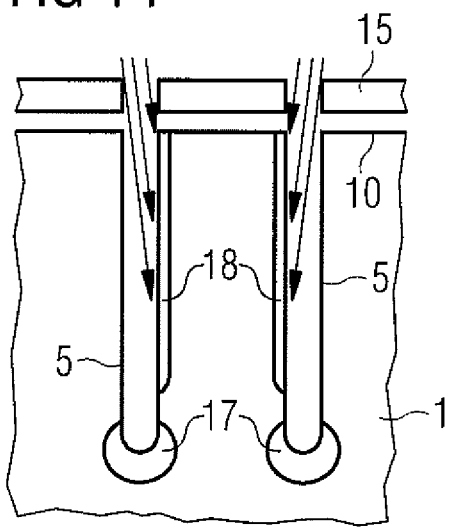
FIG. 14 shows a cross-section of an intermediate product of a further method of producing a vertical Hall sensor during an implantation into sidewalls of trenches.

FIG. 14 shows a cross-section of an intermediate product of a further method of producing a vertical Hall sensor. It can be manufactured, for instance, in a standard CMOS process including the etching of deep trenches. In the way of producing a doped well of a CMOS circuit, for example, highly doped wells are implanted from the main surface 10 of the substrate 1 into the bottoms of the trenches 5 by means of a fifth mask 15 to form doped bottom regions 17 surrounding the trench bottoms. If the substrate 1 has a weak p-type doping, the dopant of the implantation is selected for n-type conductivity, and the implantation may be performed together with the implantation of further n-type wells provided for further integrated components. Tilted implantations of a dopant for the second type of conductivity, which is n-type conductivity in the case of a p-type substrate 1, can be performed to produce a sidewall doping 18 of the trenches 5, as indicated with arrows in FIG. 14. The tilted implantations can be performed using two further masks each having an opening above one of the trenches while covering the other trench. The angle of each implantation is adapted in such a manner that the implant only reaches the sidewall that faces the neighboring trench, but not the opposite sidewall of the uncovered trench.

The trenches 5 are then preferably filled with dielectric or electrically insulating material, and the process may continue with further standard process steps. A drive-in or anneal of the doping of the doped bottom regions 17 and, if provided, also the sidewall doping 18 can be effected together with annealing steps of a CMOS process, for example, or it takes place in a dedicated diffusion step. The doping concentrations are adjusted in such a manner that the doped bottom regions 17 and the sidewall doping 18 merge in the course of the diffusion and a continuous doped sensor region is formed. If the concentration of the bottom regions 17 is sufficiently high, the whole sensor region can be formed by the diffusion of the doping atoms up to the main surface 10, and the sidewall doping 18 is not necessary in this case.

Figure 15:
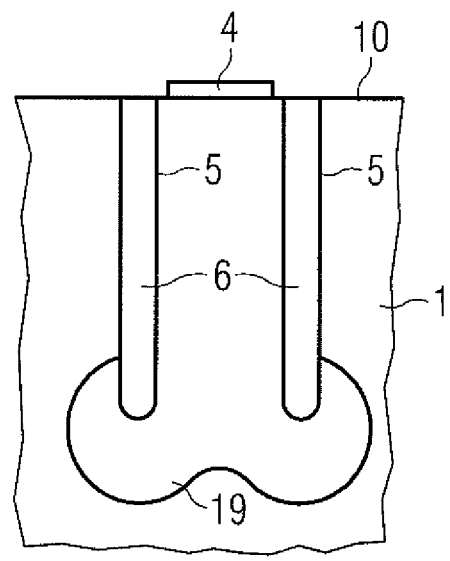
FIG. 15 shows a cross-section according to FIG. 14 after a diffusion and an application of trench fillings and contacts.

FIG. 15 shows a cross-section according to FIG. 14 after the diffusion and after an application of trench fillings 6 and contacts 4. The diffused dopant forms a continuous doped sensor region 19, which, in this embodiment, occupies the volume between the trenches 5 and surrounds the bottoms of the trenches 5. All the contacts 4 can be applied to the upper surface of the sensor region 19 located in the main surface 10, as in the previously described embodiments. Instead, in the embodiment according to FIG. 15, the bottom of the sensor region 19, which exceeds the bottoms of the trenches 5, may be electrically connected to laterally disposed contacts by means of further doped regions that are arranged on sides of the trenches opposite to the sensor region 19 or by means of sinker contacts, for example.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A vertical Hall sensor, comprising:
   a substrate comprising semiconductor material of a first type of conductivity, the substrate having a main surface;
   a doped well of a second type of conductivity at the main surface, the doped well forming a sensor region extending perpendicularly to the main surface;
   contacts of the sensor region, the contacts being located on areas of the main surface and provided for application of an operation voltage;
   further contacts located on further areas of the main surface and provided for sensing a Hall voltage, the contacts and further contacts being arranged such that, in a presence of a magnetic field component parallel to the main surface and presence of a current through the sensor region generated by an operation voltage applied to the contacts, a Hall voltage that is generated is measurable via the further contacts;
   a pn-junction between the sensor region and the semiconductor material of the first type of conductivity, the sensor region having a higher doping at an area of the pn-junction that is remote from the main surface than at the main surface; and
   trenches confining the sensor region laterally with respect to the main surface.

2. A vertical Hall sensor, comprising:
   a substrate comprising semiconductor material of a first type of conductivity, the substrate having a main surface;
   a doped well of a second type of conductivity at the main surface, the doped well forming a sensor region extending perpendicularly to the main surface;
   contacts of the sensor region, the contacts being located on areas of the main surface and provided for application of an operation voltage;
   further contacts located on further areas of the main surface and provided for sensing a Hall voltage, the contacts and further contacts being arranged such that, in a presence of a magnetic field component parallel to the main surface and presence of a current through the sensor region generated by an operation voltage applied to the contacts, a Hall voltage that is generated is measurable via the further contacts; and
   a pn-junction between the sensor region and the semiconductor material of the first type of conductivity;
   an area of the pn-junction remote from the main surface being confined by trenches laterally with respect to the main surface, and the trenches and the sensor region having depths, as measured from the main surface down into the substrate, the depth of the trenches being larger than the depth of the sensor region.

3. The Hall sensor according to claim 2, further comprising:
   further doped regions of the first type of conductivity in the sensor region at the main surface, the further doped regions extending perpendicularly to the main surface into the sensor region, and the further doped regions separating areas of the main surface on which the contacts and the further contacts are located.

4. The Hall sensor according to claim 2, wherein the substrate comprises an epilayer forming the main surface; and the sensor region extends from the main surface into the substrate at least to an interface of the epilayer.

5. The Hall sensor according to claim 4, wherein the sensor region comprises a doping that is higher at the interface of the epilayer than at the main surface.

6. The Hall sensor according to claim 2, further comprising:
   trenches confining the sensor region laterally with respect to the main surface.

7. The Hall sensor according to claim 6, wherein the trenches and the sensor region have depths, as measured from the main surface down into the substrate, the depth of the trenches being larger than the depth of the sensor region.

8. The Hall sensor according to claim 6, wherein the sensor region occupies a volume between the trenches and surrounds bottoms of the trenches.

9. A vertical Hall sensor, comprising:
   a substrate comprising semiconductor material of a first type of conductivity, the substrate having a main surface;
   a doped well of a second type of conductivity at the main surface, the doped well forming a sensor region extending perpendicularly to the main surface;
   contacts of the sensor region, the contacts being located on areas of the main surface and provided for application of an operation voltage;
   further contacts located on further areas of the main surface and provided for sensing a Hall voltage, the contacts and further contacts being arranged such that, in a presence of a magnetic field component parallel to the main surface and presence of a current through the sensor region generated by an operation voltage applied to the contacts, a Hall voltage that is generated is measurable via the further contacts;
   a pn-junction between the sensor region and the semiconductor material of the first type of conductivity, at least one of the sensor region having a higher doping at an area of the pn-junction that is remote from the main surface than at the main surface and an area of the pn-junction remote from the main surface being confined by trenches laterally with respect to the main surface, the trenches and the sensor region having depths, as measured from the main surface down into the substrate, the depth of the trenches being larger than the depth of the sensor region; and
   further doped regions of the first type of conductivity in the sensor region at the main surface, the further doped regions extending perpendicularly to the main surface into the sensor region, and the further doped regions separating areas of the main surface on which the contacts and the further contacts are located.

* * * * *